United States Patent [19]

Hartley

[11] Patent Number: 4,527,137
[45] Date of Patent: Jul. 2, 1985

[54] EVANESCENT RESONATOR FREQUENCY MULTIPLIER

[75] Inventor: Joseph H. Hartley, Jackson, N.J.

[73] Assignee: The United States of America as represented by the Secretary of the Army, Washington, D.C.

[21] Appl. No.: 544,764

[22] Filed: Oct. 24, 1983

[51] Int. Cl.³ .......................... H01P 5/12; H01P 1/20
[52] U.S. Cl. .................................. 333/137; 333/135; 333/218; 333/230; 333/99 MP
[58] Field of Search .................. 333/218, 99 MP, 125, 333/126, 135, 137; 363/157, 159, 166

[56] References Cited

U.S. PATENT DOCUMENTS 3,041,524  6/1962  Karayianis et al. ................. 333/218
3,223,918 12/1965  Ludwig et al. ...................... 333/218
3,631,331 12/1971  Fairley et al. ....................... 333/218

OTHER PUBLICATIONS

Dahele et al., *Slimguide Frequency Multipliers for Microwave Applications*, Electrical Communication, vol 49, No. 1, 1974, pp. 65-71.
IEEE Transactions on Microwave Theory and Techniques, vol. MTT-19, No. 3, Mar. 1971, George F. Craven and C. K. Mok, "The Design of Evanescent Mode Waveguide Bandpass Filters for a Prescribed Insertion Loss Characteristic".
IEEE Transactions on Microwave Theory and Techniques, vol. MTT-17, No. 12, Dec., 1969, Kenneth L. Kotzebue and George L. Matthaei, "The Design of Broad-Band Frequency Doublers Using Charge-Storage Diodes".
Proceedings of the IEEE, vol. 56, No. 2, Feb., 1968, Ronald H. Johnston and A. R. Boothroyd, "Charge Storage Frequency Multipliers".
Microwaves, Mar. 1982, John W. Archer, et al., "Harmonic Generators have High Efficiency".
IEEE Transactions on Microwave Theory and Techniques, vol. MTT-17, No. 6, Jun. 1969, Yoshio Machi, "Microwave Frequency Multiplication Using Hot Electrons in Semiconductors".

*Primary Examiner*—Paul Gensler
*Attorney, Agent, or Firm*—Anthony T. Lane; Jeremiah G. Murray; Edward Goldberg

[57] ABSTRACT

A frequency multiplier for electromagnetic waves in which multiples of the input frequency propagate, while the input frequency evanesces. A rectangular waveguide or other suitable wave conveying element with a cut-off frequency above the input frequency but below the output frequency contains the multiplying structure. The input frequency is multiplied using a post located in the waveguide or other element adjacent to the source of input waves. The post may define a multiplier gap between one of its surfaces and a wall of the waveguide or other element, in which case the multiplier gap may contain a multipactor between its surfaces which generates multiples of the input frequency. The multiplier gap may alternatively contain a non-linear element responsive to a high electric field, such as a ferroelectric material, which also generates multiples of the input frequency. Alternatively, the post may be surrounded by a non-linear element of ferromagnetic material responsive to a strong magnetic field. In either embodiment, waves at the same frequency as the input waves cannot propagate, but waves above the cut-off frequency propagate through the waveguide or other element to an output aperture.

18 Claims, 10 Drawing Figures

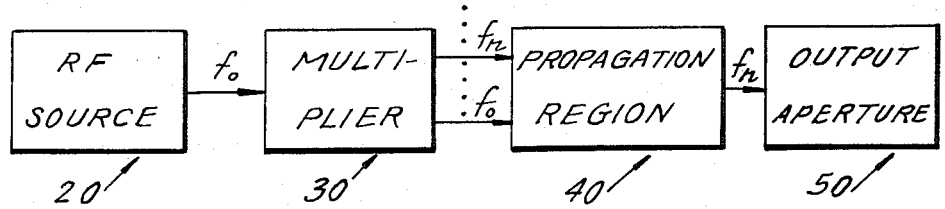
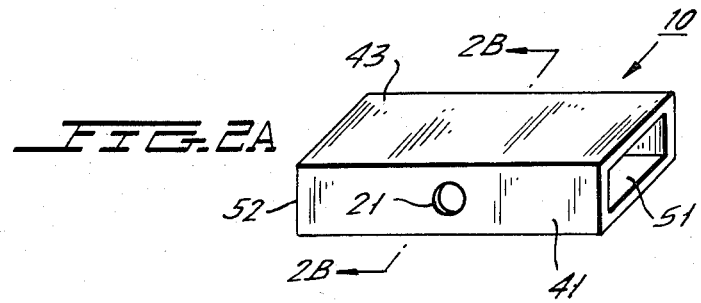
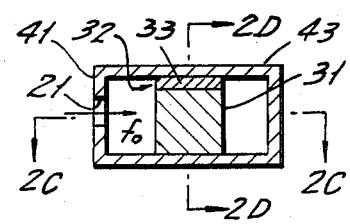
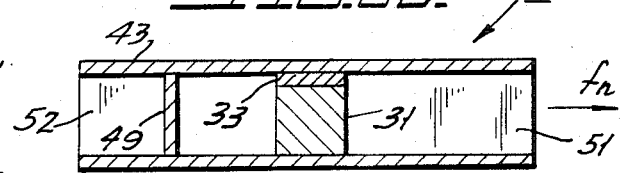
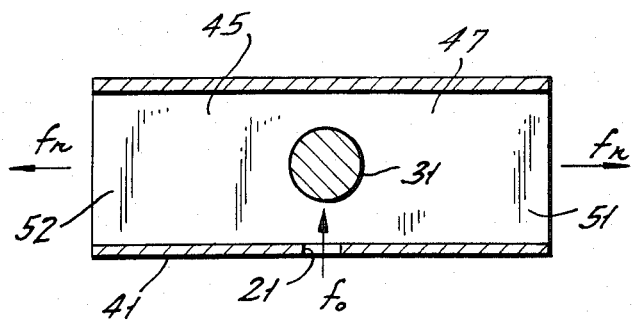

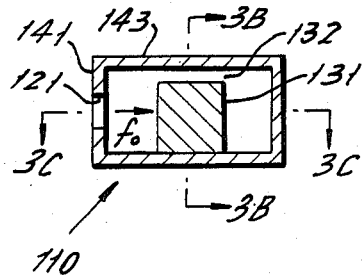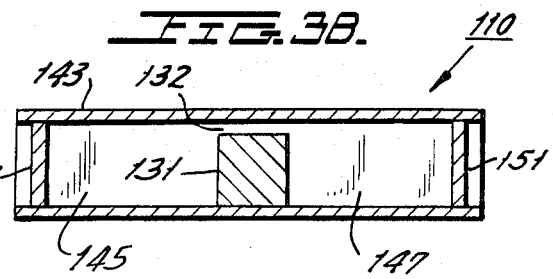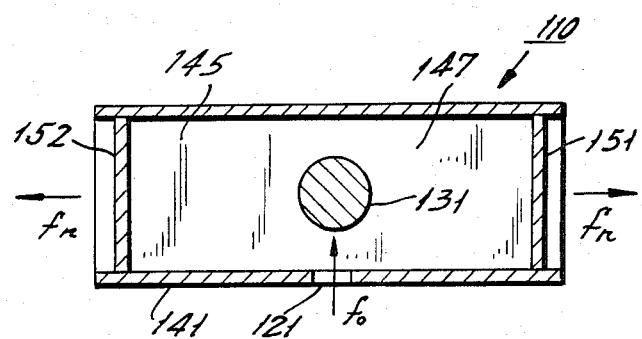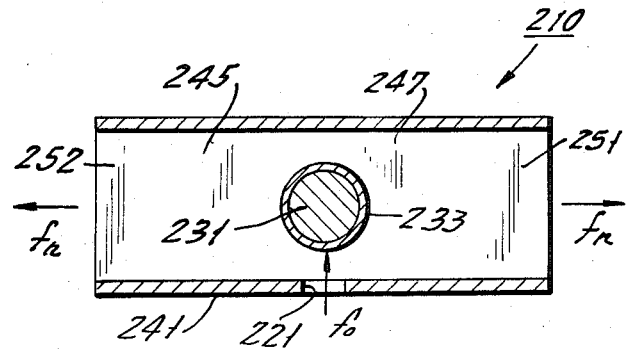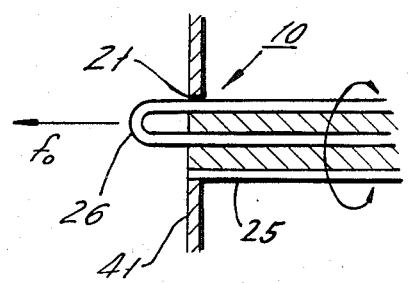

EVANESCENT RESONATOR FREQUENCY MULTIPLIER

RIGHTS TO INVENTIONS MADE UNDER FEDERALLY SPONSORED RESEARCH AND DEVELOPMENT

The invention described herein may be manufactured, used and licensed by or for the government for governmental purposes without the payment to me of any royalties thereon.

BACKGROUND OF THE INVENTION

1. Field of the Invention

The invention relates to a device for frequency multiplication of electromagnetic waves in a waveguide environment. More specifically, the invention relates to an apparatus by which an input radio frequency source at a given frequency can be used to generate an output frequency which is a multiple of the input frequency.

2. Description of the Prior Art

Frequency mutlipliers for electromagnetic waves are known in the art. The prior art frequency multipliers, however, are generally of the solid state semiconductor type, in which an input radio frequency source is coupled through a non-linear solid state semiconductor device, resulting in an output frequency different from the input frequency.

Although the prior art frequency multipliers may be used to generate an integral multiple of an input frequency, their construction is relatively complex and expensive due to the necessity of tuning and aligning the solid state semiconductor device to produce the desired frequency. Furthermore, the prior art frequency multipliers, due to their complex construction, tend to generate parasitic oscillations which must be eliminated or avoided by inclusion of additional materials.

SUMMARY OF THE INVENTION

A purpose of the invention is to provide a reliable, low cost, simple frequency multiplier for radio frequencies.

An additional object of the invention is to provide a simple frequency multiplier with no parasitic oscillation problem.

These and other objects of the invention are accomplished by means of a waveguide or other wave conveying element whose lowest propagating frequency is greater than the input frequency. In the preferred embodiment, the waveguide is a rectangular waveguide whose walls are made of a conductive metal. As is well known in the art, the geometry of such a waveguide determines a "cut-off frequency" below which waves evanesce because they cannot propagate in the waveguide but above which waves propagate through the waveguide. In the preferred embodiment, the height and width of the rectangular waveguide are chosen so that the waveguide's cut-off frequency is greater than the input frequency and less than the desired multiple of the input frequency.

The input frequency is introduced into the waveguide by a source which, in the preferred embodiment, is a loop at the end of a coaxial cable, mounted in an input aperture in the narrow side of the rectangular waveguide. Inside the waveguide is a multiplier or resonator in which waves are generated at multiples of the input frequency. This multiplier may include a gap defined by a surface of a post mounted on one wall of the waveguide on one side and the opposing waveguide wall on the other side. The multiplier gap functions by means of multipactoring or by use of non-linear materials. In a first preferred embodiment, the multiplier gap contains a ferroelectric material non-linearly responsive to a high electric field. In a second preferred embodiment, the multiplier gap contains a vacuum for generating frequency multiples by a high impedance vacuum process such as secondary electron resonance, also known as a multipactor. In a third preferred embodiment, the multiplier includes a non-linear element which is a ferromagnetic material surrounding the post and non-linearly responsive to a strong magnetic field.

The invention operates when the input frequency enters the waveguide through the input aperture. The input frequency excites the multipactor or non-linear element, which is responsive to the input frequency. Therefore, in the multiplier, frequencies which are multiples of the input frequency are generated by processes such as secondary electron resonance or, alternatively, by the non-linear characteristics of materials. Although the input frequency cannot propagate in the waveguide, because it is below the cut-off frequency, the desired multiple of the input frequency is above the cut-off frequency and can propagate. Therefore, the input frequency is confined in the waveguide, while the desired multiple propagates down the waveguide toward an output aperture.

In addition, in one embodiment, the waveguide has two output apertures, the outputs from which are combined externally to give a single output. In another embodiment, a shorting plane is located in the waveguide, which has only a single output aperture. In either case, windows may be placed in the output aperture or apertures of the waveguide and at the input aperture to maintain a vacuum in the multiplier gap.

Other objects, features and advantages of the invention will be apparent from the following description, together with the accompanying drawings and the appended claims.

BRIEF DESCRIPTION OF THE DRAWINGS

For the purpose of illustrating the invention, there are shown in the drawings several forms which are presently preferred, it being understood, however, that this invention is not limited to the precise arrangements and instrumentalities shown.

FIG. 1 is a functional block diagram illustrating the operation of the invention.

FIG. 2A is a perspective side view of the first preferred embodiment of the invention, showing a waveguide section in which the invention is constructed.

FIG. 2B is a transverse cross-sectional view of the wave guide section of FIG. 2A, taken in the direction of arrows 2B—2B.

FIG. 2C is a longitudinal cross-sectional view of the wave guide section of FIG. 2A, taken in the direction of arrows 2C—2C in FIG. 2B.

FIG. 2D is a longitudinal cross-sectional view of an alternative embodiment of the wave guide of FIG. 2A, taken in the direction of arrows 2D—2D in FIG. 2B, and illustrating use of a shorting plane.

FIG. 3A is a transverse cross-sectional view of the second preferred embodiment of the invention, taken in the direction of arrows 2B—2B in FIG. 2A.

FIG. 3B is a longitudinal cross-sectional view of the embodiment of FIG. 3A, taken in the direction of arrows 3B—3B in FIG. 3A.

FIG. 3C is another longitudinal cross-sectional view of the embodiment of FIG. 3A, taken in the direction of arrows 3C—3C in FIG. 3A.

FIG. 4 is a longitudinal cross-sectional view of an alternative embodiment using a ferromagnetic non-linear element, taken in the direction of arrows 2C—2C in FIG. 2B.

FIG. 5 is a cross-sectional view of the loop used as the source of the input frequency in the preferred embodiment.

DETAILED DESCRIPTION OF THE PREFERRED EMBODIMENTS

1. Operation—General

FIG. 1 shows the operation of the invention, by showing the functions which are preformed in the frequency multiplier of the invention. As can be seen, radio frequency source or aperture 20, which may be any source of radio frequency waves, ranging at least from 100 megahertz to 16 gigahertz, introduces the input frequency $f_O$ into the frequency multiplier. Waves at the input frequency $f_O$ then propagate to the multiplier 30, a component which, in the preferred embodiment, includes a gap defined by one surface of a post and a wall of the frequency multiplier cavity. This multiplier generates waves at multiples of the input frequency $f_O$, which are represented in FIG. 1 as $f_O \ldots f_n \ldots$. Because the propagation region 40 of the frequency multiplier has a cut-off frequency $f_c$ above $f_O$ but below some multiple of $f_O$, $f_n$, those multiples of $f_O$ which are below the cut-off frequency $f_c$, are confined and do not propagate. Those frequencies which are above $f_c$, $f_n$, $f_{n+1}, \ldots$ will propagate through the propagation region 40 to an output aperture 50.

The specific structural features which correspond to each of the functional components of FIG. 1 are labeled in the following description with reference numerals indicating the correspondence. In the first preferred embodiment, the first digit of each two digit reference numeral in FIGS. 2A-2D and 5 is the same as that of the corresponding functional component in FIG. 1. In the second and third preferred embodiments, the first digit of each three digit reference numeral is "1" and "2", respectively, and the last two digits are the same as the two digit reference numerals for corresponding features in the first preferred embodiment.

2. First Preferred Embodiment

FIG. 2A shows a perspective side view of the first preferred embodiment of the invention in a rectangular wave guide 10. Although rectangular waveguide is preferred because of its ready availability in standard sizes with matched accessories and instrumentation, the invention will work with any other wave conveying element having a cut-off frequency greater than $f_O$ and less than $f_n$. Wave guide 10 includes a narrow wall 41 and a wide wall 43 which together with opposite walls surround a propagation region. Input aperture 21 is located in narrow wall 41, and permits waves at the input frequency $f_O$ to enter the propagation region. In the preferred embodiment, waves at the input frequency $f_O$ are introduced into the propagation region by a loop discussed in reference to FIG. 5 below.

FIG. 2A also shows the output openings or apertures of the propagation region 51, 52. In one embodiment of the invention, waves at the output frequency $f_n$ leave waveguide 10 through both openings 51, 52 and are subsequently combined in phase by appropriate connections (not shown).

FIG. 2B shows a cross-section of the waveguide 10 of FIG. 2A, and particularly shows the location of post 31 in relation to the input aperture 21. As can be seen from FIG. 2B, post 31 may, in one embodiment of the invention, be located in the center of the wall opposite wide wall 43. FIG. 2B also shows the location of multiplier gap 32, which is located between the surface of post 31 and wide wall 43. Like waveguide 10, post 31 is composed of a conductive material, such as copper. As a result, intense electric field effects occur in multiplier gap 32. These effects result from the resonance of the post and surrounding waveguide at $f_O$. This resonance results in a concentration of energy in the multiplier gap 32, and allows the generation of waves at multiples of $f_O$.

Although FIG. 2B shows the post 31 having a straight vertical profile, this is only for purposes of illustration. Applicant has found in practice that a wide variety of shapes can be used to obtain resonances at different frequencies. For example, post 31 may be circular, square, rectangular, conical or shaped like a toadstool, with a wider section at the end facing wall 43. It may also have a wide variety of diameters and spacings from wall 43. The choice of post 31 for a particular application is considered to be well within the skill of one of ordinary skill in the art.

FIG. 2B also shows the non-linear element 33 located in the multiplier gap 32 in the first preferred embodiment. This non-linear element is glued or cemented in place by a thin film of an adhesive substance on post 31 and wall 43. The non-linear element may be any material which emits waves at the desired frequency $f_n$ when stimulated by electric field effects at the input frequency $f_O$. Lithium tantalate and lithium niobate, for example, may be used, although other suitable materials are well known and may also be used.

FIG. 2C shows a longitudinal cross-sectional view of the waveguide of the first embodiment of the invention. In propagation region 45, 47, waves emitted from the multiplier cannot propagate if below the cut-off frequency $f_c$. Other waves, such as $f_n$, propagate because they are above $f_c$, as is well known in the wave guide art. Therefore, waves at $f_n$ leave the waveguide through the output apertures and can be combined externally in phase to provide a single output.

FIG. 2D shows an alternative embodiment for combining waves internally. Shorting plane 49 is located near one end 52 of the waveguide. If properly located in relation to the phase of the wave propagating at $f_n$, shorting plane 49 will act as if it were a reflector, and will result in combination of waves internally rather than externally. The location of shorting plane 49 at a plane of zero potential is well within the ordinary skill in the art.

FIG. 2C shows post 31 having a circular cross-section but, as discussed above, this is only for purposes of illustration. A wide variety of shapes and sizes of conducting material could be used for post 31, as long as resonance is obtained.

3. Second Preferred Embodiment

FIG. 3A shows a second preferred embodiment of the invention, waveguide 110, in the same cross-section as in FIG. 2B. In FIG. 3A, multiplier gap 132 is empty. Under the well known phenomenon of secondary electron resonance, or multipactoring, if a high vacuum is maintained in a properly shaped space such as multiplier gap 132 and if the upper surface of post 131 and the opposite surface of wall 143 are coated with a good secondary electron emitting material such as silver, gold or platinum, secondary electron resonance will occur, generating multiple frequencies. In order to maintain the requisite vacuum, wave guide windows must be placed in aperture 121 and in at least one of the output openings. If the outputs are to be combined, wave guide windows 151, 152 could be placed in both output openings, as shown in FIG. 3B, but if not, a termination could be placed in one of the output openings, thereby reducing the power output by a factor of 2. Alternatively, a shorting plane like that shown in FIG. 2D could be placed at an appropriate point in waveguide 110, resulting in no loss of power at the output opening, provided a vacuum is maintained.

FIG. 3C shows operation of the second preferred embodiment. Input frequency $f_O$ enters the window at aperture 121. Multiplier gap 132, shown in FIGS. 3A and 3B, generates multiples of $f_O$ by multipactoring. Frequencies below $f_c$ cannot propagate in propagation regions 145, 147. Frequency $f_n$, however, is above $f_c$ and passes through windows 151, 152 to output.

4. Third Preferred Embodiment

FIG. 4 illustrates a third preferred embodiment of the invention in which a non-linear element 233 surrounds post 231. Due to the high magnetic field around resonant post 231, which couples to the non-linear element 233, multiples of input frequency $f_O$ are generated. The non-linear element 233 may be any material which emits waves at the desired frequency $f_n$ when stimulated by magnetic field effects at the input frequency $f_O$. Ferromagnetic materials, such as ferrites may be used, for example, although other suitable materials are well known and may also be used. Also, the shape and size of non-linear element 233 are variable, although a ring shape is shown in FIG. 4. FIG. 4 also shows input aperture 221 which, if ferromagnetic material as in FIG. 4 is used, need not have a window, since such material does not require a vacuum for its operation.

5. Coaxial Loop

Although input waves at $f_O$ may be introduced by any conventional means through aperture 21 into waveguide 10, applicant has found the arrangement in FIG. 5 to be most useful in the invention. As shown there, coaxial cable 25 is connected to aperture 21 in wall 41 of waveguide 10. The inner conductor is connected to the outer conductor of cable 25, forming loop 26 inside the waveguide. The connection of cable 25 to the wall is such that the cable can be rotated and moved in and out to obtain various orientations of loop 26.

By adjusting the angular orientation and the depth of penetration of loop 26 under non-operating conditions, the operator can obtain a high degree of resonator overcoupling. In operation, input power is set at a value such that gap loading results in optimum resonator coupling.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A frequency multiplier for electromagnetic waves, comprising:

a metallic waveguide in which electromagnetic waves propagate at or above a cut-off frequency and in which electromagnetic waves below the cut-off frequency cannot propagate, the waveguide having a first output aperture at one end for coupling out electromagnetic waves therefrom;

an input aperture in a side wall of said waveguide;

a source for introducing input waves at a predetermined input frequency below the cut-off frequency through said input aperture into the waveguide; and a conductive post positioned on an inner wall and extending transversely toward the opposite wall of said waveguide to provide a predetermined narrow gap therebetween, the dimensions of said gap and post and waveguide determining said input frequency, said post being positioned at a location spaced longitudinally from the output aperture and laterally from the input aperture and including a coating of multiplier material disposed on a surface of said post providing a non-linear response for receiving said input frequency waves from said source and for generating waves at a predetermined output frequency greater than the cut-off frequency, said narrow gap between said post and opposite wall being empty except for any portion occupied by said multiplier material.

2. The frequency multiplier of claim 1 in which the waveguide has a second output aperture for coupling out electromagnetic waves therefrom, the second output aperture being at a location spaced longitudinally from said input and first output apertures.

3. The frequency multiplier of claim 1 in which the multiplier material generates waves at an output frequency which is an integral multiple of the input frequency.

4. The frequency multiplier of claim 1 in which the input aperture and the post are at a common longitudinal position along the waveguide.

5. The frequency multiplier of claim 1 in which the multiplier material surrounds the post for generating frequencies higher than the input frequency.

6. The frequency multiplier of claim 1, in which the wave guide is rectangular.

7. The frequency multiplier of claim 6 in which the wave guide includes a shorting plate, the post being disposed between and at a location spaced longitudinally from the shorting plate and the output aperture.

8. The frequency multiplier of claim 6 in which the rectangular waveguide has two wide walls and two narrow walls, the post being mounted centrally on a wide wall of the rectangular waveguide and the input aperture being disposed in a narrow wall of the rectangular waveguide.

9. The frequency multiplier of claim 1, in which the multiplier material is disposed in said narrow gap positioned between the outer end of said post and an adjacent portion of said opposite wall.

10. The frequency multiplier of claim 9 in which the post is circular.

11. The frequency multiplier of claim 9 in which the outer end of the post and the adjacent portion of the opposite wall define the first and second side of the gap and said multiplier material includes a coating on said sides of highly active material for promoting secondary electron resonance and in which the multiplier gap is positioned within a vacuum.

12. The frequency multiplier of claim 11, further comprising a window in the output aperture for maintaining said vacuum.

13. The frequency multiplier of claim 11 including a window mounted in the input aperture for maintaining said vacuum.

14. The frequency multiplier of claim 9 in which the multiplier gap is filled with a material having a non-linear characteristic for generating output frequencies greater than the input frequency.

15. The frequency multiplier of claim 14 in which the non-linear material is a ferro-electric substance.

16. The frequency multiplier of claim 1 in which the source of input waves is a coaxial cable including a conductive loop connecting the inner conductor of the coaxial cable to the outer conductor of the coaxial cable and to the waveguide wall.

17. The frequency multiplier of claim 1 in which the conductive loop is rotatable for optimal alignment.

18. The frequency multiplier of claim 17 in which the coaxial cable is movable to an optimal depth of penetration into the waveguide.

* * * * *